(12) United States Patent
Ahn et al.

(10) Patent No.: US 8,993,411 B2
(45) Date of Patent: Mar. 31, 2015

(54) METHOD FOR FORMING PAD IN WAFER WITH THREE-DIMENSIONAL STACKING STRUCTURE

(71) Applicant: Siliconfile Technologies Inc., Seoul (KR)

(72) Inventors: Heui-Gyun Ahn, Seongnam-si (KR); Se-Jung Oh, Seoul (KR); In-Gyun Jeon, Seongnam-si (KR); Jun-Ho Won, Seoul (KR)

(73) Assignee: Siliconfile Technologies Inc., Seoul (KR)

( * ) Notice: Subject to any disclaimer, the term of this patent is extended or adjusted under 35 U.S.C. 154(b) by 0 days.

(21) Appl. No.: 13/775,178

(22) Filed: Feb. 23, 2013

(65) Prior Publication Data

US 2013/0189828 A1    Jul. 25, 2013

Related U.S. Application Data

(62) Division of application No. 13/026,963, filed on Feb. 14, 2011, now Pat. No. 8,399,282.

(30) Foreign Application Priority Data

Feb. 22, 2010    (KR) ................. 10-2010-0015632

(51) Int. Cl.
*H01L 21/46* (2006.01)
*H01L 23/00* (2006.01)
*H01L 21/683* (2006.01)
*H01L 23/48* (2006.01)
*H01L 27/146* (2006.01)

(52) U.S. Cl.
CPC ............ *H01L 24/03* (2013.01); *H01L 21/6835* (2013.01); *H01L 23/481* (2013.01); *H01L 27/1462* (2013.01); *H01L 27/14636* (2013.01); *H01L 27/1464* (2013.01); *H01L 24/05* (2013.01); *H01L 2221/68372* (2013.01); *H01L 2224/05093* (2013.01); *H01L 2924/01046* (2013.01); *H01L 2924/01078* (2013.01)
USPC ................. 438/459; 438/70; 438/72; 438/74; 438/455; 257/459; 257/E31.001; 257/E31.127; 257/E31.137; 257/E21.311

(58) Field of Classification Search
None
See application file for complete search history.

(56) References Cited

U.S. PATENT DOCUMENTS

2007/0117254 A1* 5/2007 Pain ............................. 438/75
2009/0081822 A1* 3/2009 Palsule et al. ................. 438/69

* cited by examiner

*Primary Examiner* — Yasser A Abdelaziez
(74) *Attorney, Agent, or Firm* — Kile Park Reed & Houtteman PLLC

(57) ABSTRACT

A method for forming a pad in a wafer with a three-dimensional stacking structure is disclosed. The method includes bonding a device wafer that includes an Si substrate and a handling wafer, thinning a back side of the Si substrate, depositing an anti-reflective layer on the thinned back side of the Si substrate, depositing a back side dielectric layer on the anti-reflective layer, defining a space for a pad in the back side dielectric layer and forming vias that pass through the back side dielectric layer and the anti-reflective layer and contact back sides of super contacts which are formed on the Si substrate, filling one or more metals in the vias and the defined space for the pad, and removing a remnant amount of the metal filled in the space for the pad through planarization by a CMP (chemical mechanical polishing) process.

14 Claims, 7 Drawing Sheets

METHOD FOR FORMING PAD IN WAFER WITH THREE-DIMENSIONAL STACKING STRUCTURE

CROSS-REFERENCE TO RELATED APPLICATIONS

This application is a divisional application of U.S. patent application Ser. No. 13/026,963, filed on Feb. 14, 2011 (now pending), which claims priority to Korean Patent Application No. 10-2010-0015632, filed Feb. 22, 2010, the entire contents of which are incorporated herein by reference.

BACKGROUND OF THE INVENTION

1. Field of the Invention

The present invention relates to a method for forming a pad in a wafer with a three-dimensional stacking structure, and more particularly, to a method for forming a pad in a wafer with a three-dimensional stacking structure, in which a process for etching an Si substrate is not separately performed after a process for thinning the back side of a device wafer, vias are formed on the back sides of super contacts after forming dielectric layers, and a pad is formed on the back sides of the vias.

2. Description of the Related Art

A wafer stacking technology will be a key technology for a next-generation high-end semiconductor. In order to manufacture such a semiconductor, numerous companies conduct research and development.

One of important technologies for wafer stacking is a technology of forming a pad after bonding.

FIGS. 1a through 1c show a series of processes for forming a pad according to the conventional art.

FIG. 1a illustrates a cross-section when a process for thinning the back side of a device wafer is performed after bonding a handling wafer and the device wafer according to the conventional art.

Referring to FIG. 1a, in the conventional art, an Si substrate 110 has a thickness of approximately 3.5 µm by a back side thinning process.

FIG. 1b illustrates a cross-section after a process for etching an Si substrate and a process for depositing a dielectric material according to the conventional art.

Referring to FIG. 1b, in a first step, the thickness of the Si substrate 110 is reduced from 3.5 µm to 3 µm through etching. After the first step is completed, an $SiO_2$ layer 121, an SiN layer 123 and an $SiO_2$ layer 125 as dielectric materials are sequentially formed on the back side of the etched Si substrate 110 in a second step.

FIG. 1c illustrates a cross-section after a process for planarizing a dielectric layer and a process for forming a pad according to the conventional art.

Referring to FIG. 1c, in a first step, the $SiO_2$ layer 125 is planarized through CMP (chemical mechanical polishing).

After the first step is completed, a pad 130 is formed by performing metal (Al) deposition, photolithography and etching which are generally known in the art.

The conventional method for forming a pad has problems as described below.

First, in the conventional art, after back side thinning of a device wafer 110b, the Si substrate 110 is separately etched as shown in FIG. 1b. Therefore, it is necessary to consider the final thickness of the Si substrate 110, and the imaging characteristics of an image sensor are likely to deteriorate due to damage to super contacts 120 or the surface of the Si substrate 110.

Second, since the number and the density of the super contacts 120 are small, dishing is likely to occur when planarizing the dielectric layer as shown in FIG. 1c. As a consequence, it is difficult to perform subsequent processes. Also, because target setting for the planarization of the dielectric layer is required, it is necessary to isolate the Si substrate 110 and the pad 130 from each other.

SUMMARY OF THE INVENTION

Accordingly, the present invention has been made in an effort to solve the problems occurring in the related art, and an object of the present invention is to provide a method for forming a pad in a wafer with a three-dimensional stacking structure, in which a process for etching an Si substrate is not separately performed after a process for thinning the back side of a device wafer, vias are formed on the back sides of super contacts after forming dielectric layers, and a pad is formed on the back sides of the vias, so that the pad can be realized in a simple manner without causing damage to the surfaces of the super contacts and the Si substrate.

In order to achieve the above object, according to an aspect of the present invention, there is provided a method for forming a pad in a wafer with a three-dimensional stacking structure, including: (a) a first process of bonding a device wafer and a handling wafer; (b) a second process of thinning a back side of an Si substrate which is formed on the device wafer, after the first process; (c) a third process of forming an anti-reflective layer and a PMD (preferential metal deposition) dielectric layer, after the second process; (d) a fourth process of forming vias on back sides of super contacts which are formed on the Si substrate, after the third process; and (e) a fifth process of forming a pad, after the fourth process.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Figure 1A:
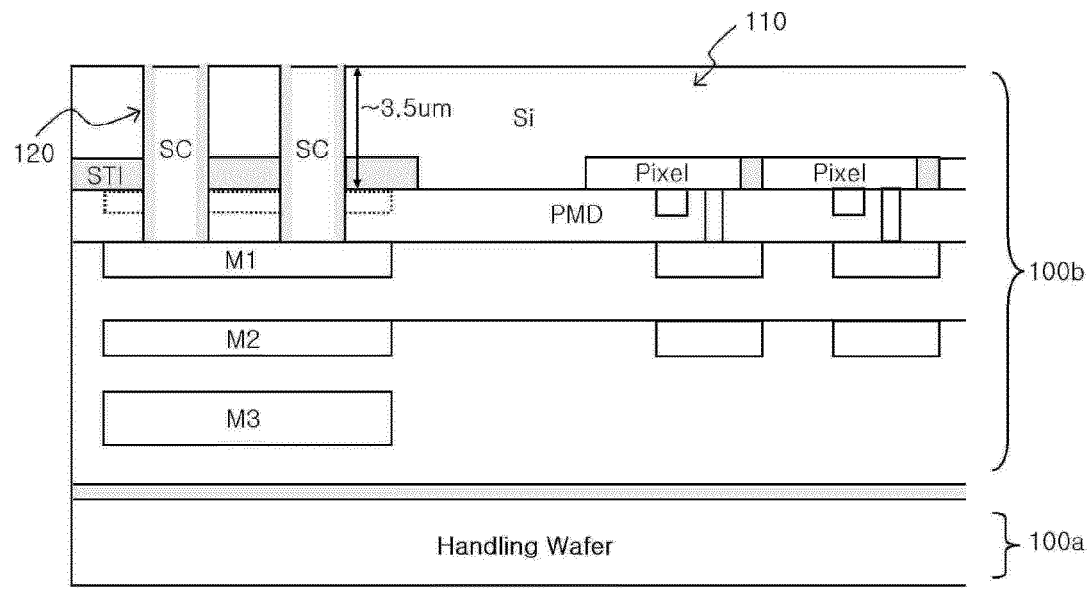
FIG. 1a illustrates a cross-section when a process for thinning the back side of a device wafer is performed after bonding a handling wafer and the device wafer according to the conventional art.

Reference will now be made in greater detail to a preferred embodiment of the invention, an example of which is illustrated in the accompanying drawings. Wherever possible, the same reference numerals will be used throughout the drawings and the description to refer to the same or like parts.

FIGS. 2a through 2e show a series of processes for forming a pad in accordance with an embodiment of the present invention.

In general, stacking technologies are divided into a stacking bonding process including interconnection and a bonding process simply for back side illumination (BSI).

The stacking bonding process is a process in which a logic wafer and a sensor wafer are separately manufactured and are then bonded with each other. In the logic wafer, peripheral circuits are mainly formed, and in the sensor wafer, photodiodes are mainly formed and transistors are partially formed.

In the bonding process for back side illumination, logics and sensors are formed on a single device wafer. Then, in order to use the device wafer in a state in which the device wafer is turned over, a handling wafer, on which an oxide is simply deposited without performing any other processes, is bonded to the device wafer.

Accordingly, in a wafer with a three-dimensional stacking structure in accordance with the embodiment of the present invention, a handling wafer 200a and a device wafer 200b are first bonded with each other through a bonding process for back side illumination.

The device wafer 200b includes an image sensor region 205 in which image sensor devices are formed, and a semiconductor circuit region 207 in which general semiconductor circuits are formed.

In the image sensor region 205, photodiodes 201 are formed by a method generally known in the art, and an interlayer dielectric layer 202 and a plurality of metal wiring lines 203 are formed on the lower surfaces of the photodiodes 201 to face the front side of the handling wafer 200a.

Due to this fact, in the embodiment of the present invention, a back side illumination image sensor is constructed such that light collection is implemented under the photodiodes (PD), that is, from the back side of the wafer, unlike a front side illumination (FSI) image sensor in which light collection is implemented from the front sides of the photodiodes (PD).

In the semiconductor circuit region 207, the interlayer dielectric 202 and a plurality of multi-layered metal wiring lines 204 are formed on the lower surface of the Si substrate 210 to face the front side of the handling wafer 200a.

Super contacts 211 are formed in the Si substrate 210 in such a way as to contact the metal wiring lines 204.

Hereafter, processes, which are performed after bonding the device wafer 200b having the image sensor region 205 and the semiconductor circuit region 207 with the handling wafer 200a, will be described with reference to FIGS. 2a through 2e.

Figure 2A:
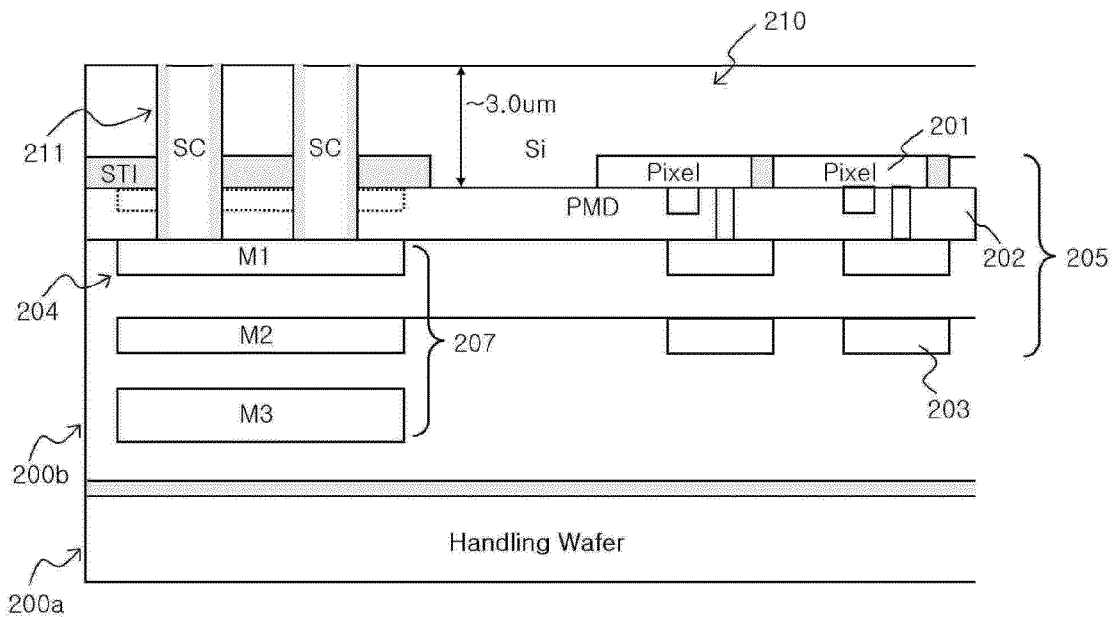
FIG. 2a illustrates a cross-section when a process for thinning the back side of a device wafer is performed after a bonding process, in accordance with an embodiment of the present invention.

FIG. 2a illustrates a cross-section when a process for thinning the back side of a device wafer is performed after a bonding process, in accordance with the embodiment of the present invention.

Figure 1B:
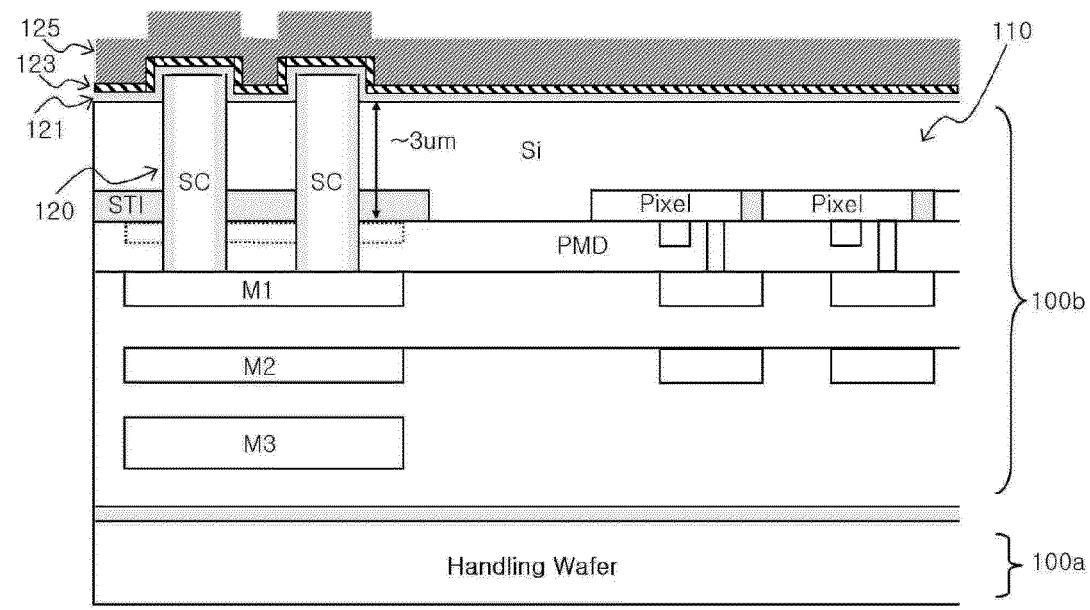
FIG. 1b illustrates a cross-section after a process for etching an Si substrate and a process for depositing a dielectric material according to the conventional art.
Figure 1C:
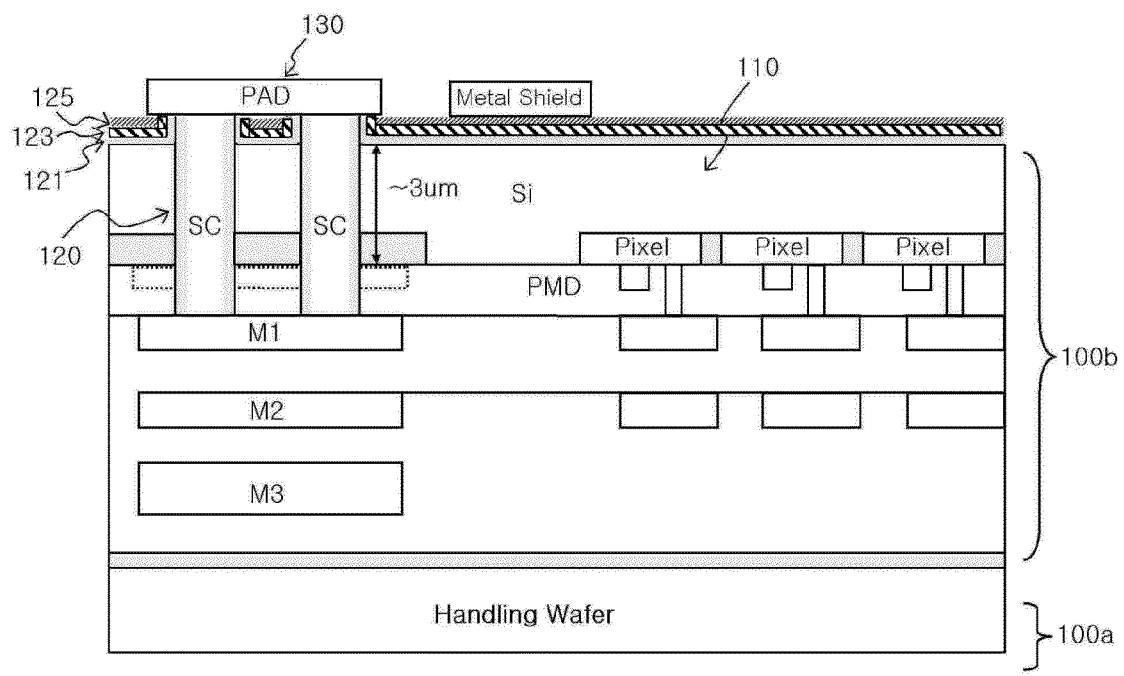
FIG. 1c illustrates a cross-section after a process for planarizing a dielectric layer and a process for forming a pad according to the conventional art.

Referring to FIG. 2a, the Si substrate 210 in accordance with the embodiment of the present invention has a thickness of 2 μm to 6 μm, preferably, 3 μm, by a back side thinning process performed for a device wafer. Due to this fact, the embodiment of the present invention is distinguished from the conventional art in which the Si substrate 110 is etched to have a thickness of 3.5 μm to 3 μm as can be seen from FIG. 1b.

Therefore, in the embodiment of the present invention, unlike the conventional art, it is not necessary for the super contacts 211 to project out of the Si substrate 210, whereby it is possible to prevent the super contacts 211 from being damaged.

Figure 2B:
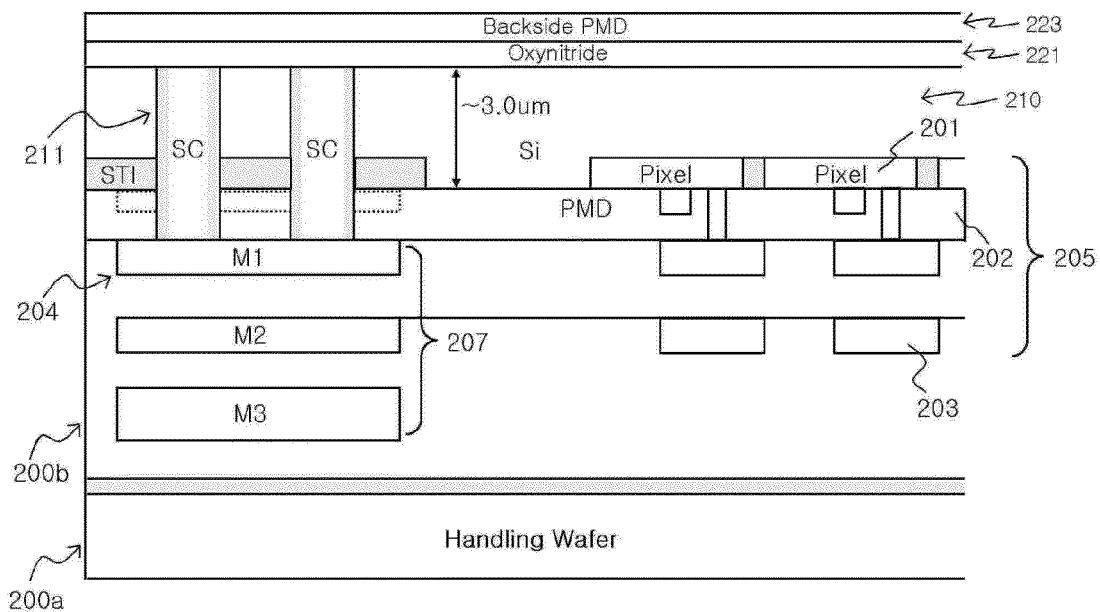
FIG. 2b illustrates a cross-section after processes for forming an anti-reflective layer and a PMD (preferential metal deposition) dielectric layer according to the present invention.

FIG. 2b illustrates a cross-section after processes for forming an anti-reflective layer and a PMD (preferential metal deposition) dielectric layer according to the present invention.

Referring to FIG. 2b, an anti-reflective layer 221 is formed to face the back side of the Si substrate 210, and then, a PMD dielectric layer 223 is formed on the back side of the anti-reflective layer 221.

The anti-reflective layer 221 is deposited to a thickness equal to or less than 500 Å using oxynitride or oxide-nitride-oxide, and the PMD dielectric layer 223 is deposited to a thickness of 1,000 Å to 5,000 Å.

Figure 2C:
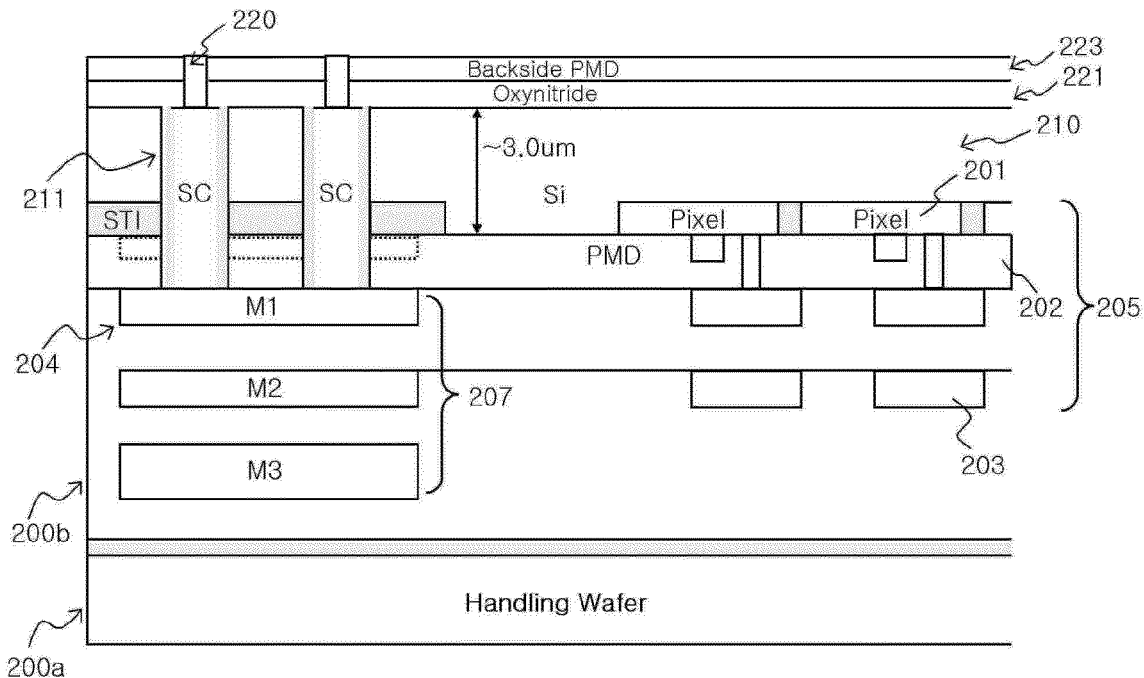
FIG. 2c illustrates a cross-section after a process for forming vias for pad opening according to the present invention.

FIG. 2c illustrates a cross-section after a process for forming vias for pad opening according to the present invention.

Referring to FIG. 2c, a process for forming vias 220 includes a first step of defining via holes passing through the PMD dielectric layer 223 and the anti-reflective layer 221 through performing photolithography well known in the art, a second step of performing chemical vapor deposition (CVD) or physical vapor deposition (PVD) to fill the via holes with tungsten (W) as a metallic material, and a third step of planarizing a resultant structure through performing chemical mechanical polishing (CMP).

Figure 2D:
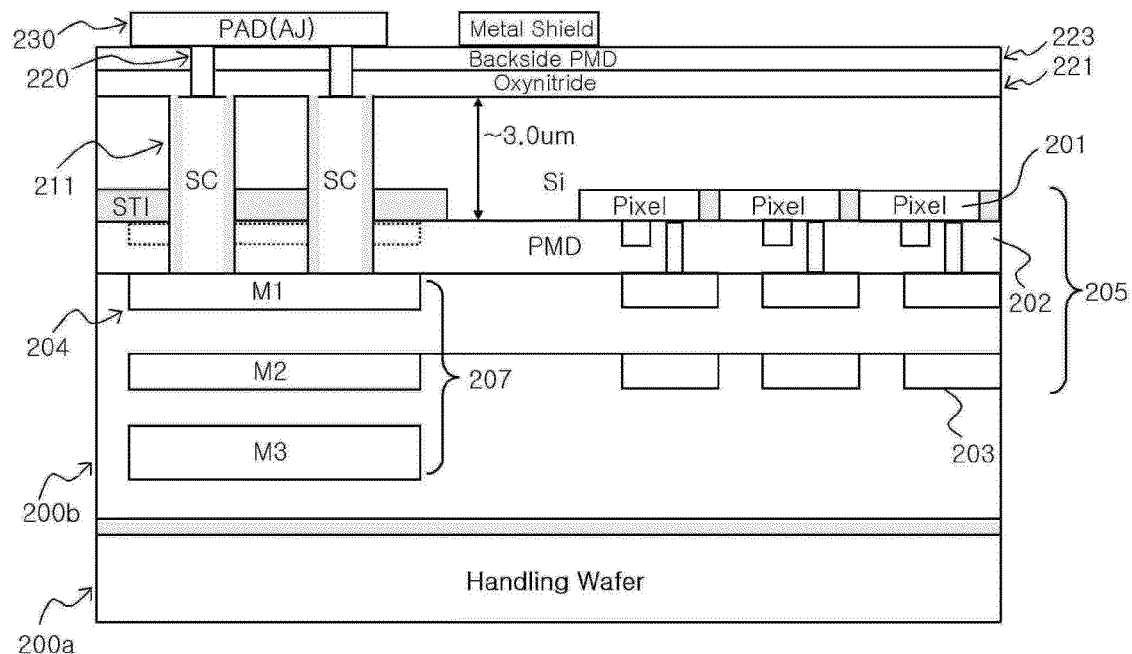
FIG. 2d illustrates a cross-section after a process for forming a pad according to the present invention.

FIG. 2d illustrates a cross-section after a process for forming a pad according to the present invention.

Referring to FIG. 2d, a process for forming a pad 230 according to the embodiment of the present invention is performed on the back side of the PMD dielectric layer 223 such that the pad 230 is electrically connected with the back sides of the vias 220. The pad 230 may be formed of a conductive material, for example, any one of a metal and an alloy in which at least two kinds of metals are mixed. Preferably, the pad 230 is formed of aluminum (Al).

Figure 2E:
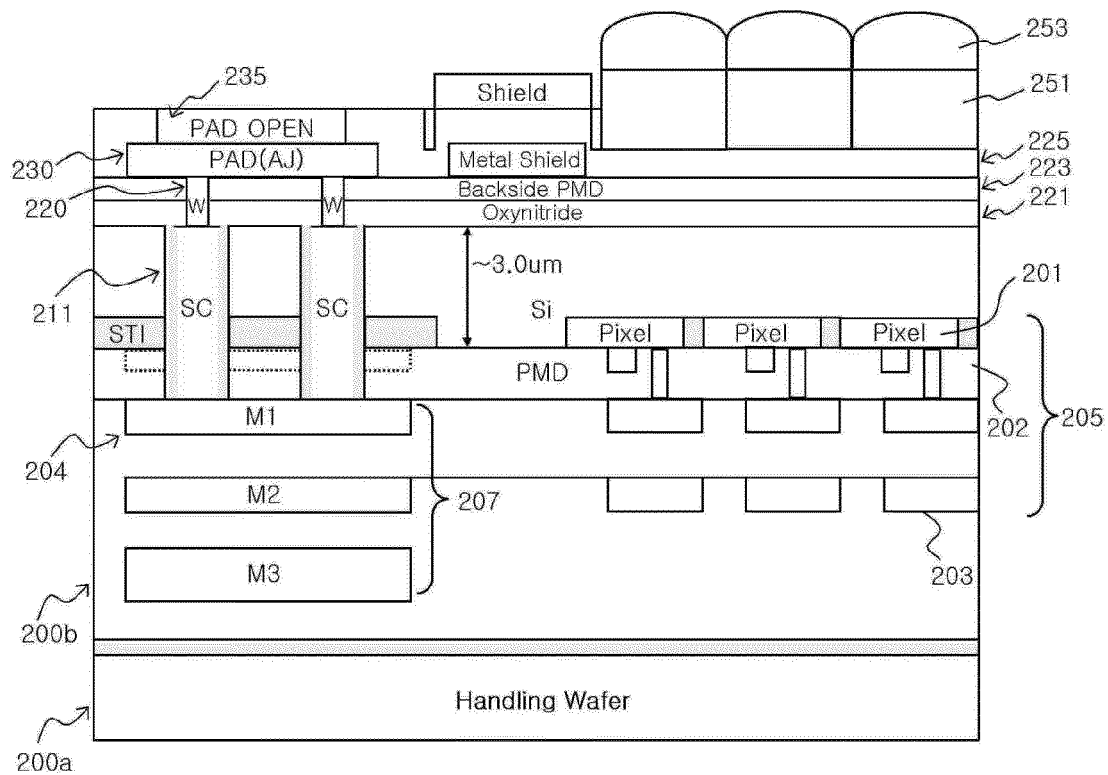
FIG. 2e illustrates a complete cross-section after a process for opening the pad and processes for forming color filters and microlenses according to the present invention.

FIG. 2e illustrates a complete cross-section after a process for opening the pad and processes for forming color filters and microlenses according to the present invention.

Referring to FIG. 2e, in a process for opening the pad 230, similarly to the process for forming the vias 220 as described with reference to FIG. 2c, a dielectric material such as an oxide or a nitride is applied on the back side of the pad 230, and a pad open region 235 is defined by performing photolithography.

In addition, in order to improve light collection capability of the photodiodes 210 for back side illumination, the embodiment of the present invention may include a first step of forming optical filters 251 for transmitting light of a specified band, on the back side of the dielectric material and a second step of forming microlenses 253 for focusing light, on the optical filters 251.

Figure 3:
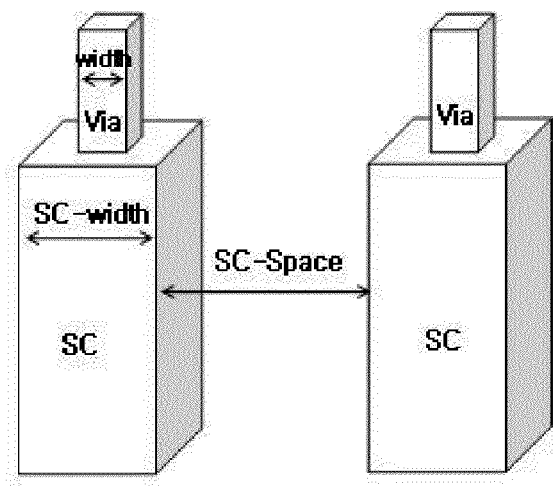
FIG. 3 is a view explaining the design rule of a via in the present invention.

FIG. 3 is a view explaining the design rule of a via in the present invention.

Referring to FIG. 3, a design rule for the layout of vias in the present invention may be controlled in consideration of a design rule of super contacts.

That is to say, when a design rule is defined as width/spacing, a design rule of super contacts in the present invention becomes 0.7 μm/0.7 μm~3.0 μm/5.0 μm [width/spacing], and a design rule of vias is determined in consideration of such a design rule of super contacts.

Preferably, a design rule of vias in the present invention is determined to be 0.1 μm/0.1 μm~0.5 μm/0.5 μm [width/spacing].

FIGS. 4a through 4d show a series of processes for forming a pad in accordance with another embodiment of the present invention.

Figure 4A:
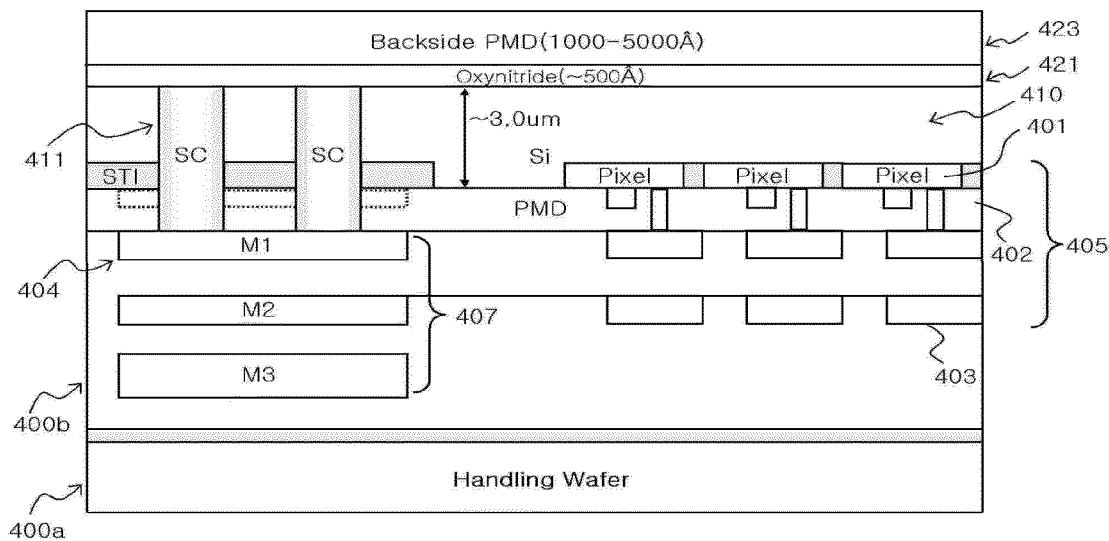
FIG. 4a illustrates a cross-section after processes for forming an anti-reflective layer and a PMD dielectric layer in accordance with another embodiment of the present invention.

FIG. 4a illustrates a cross-section after processes for forming an anti-reflective layer and a PMD dielectric layer in accordance with another embodiment of the present invention.

Referring to FIG. 4a, a process for forming an anti-reflective layer 421 is performed after completing bonding and back side thinning of a device wafer 400b as aforementioned with reference to FIG. 2a. The anti-reflective layer 421 is formed to face the back side of an Si substrate 410, and a PMD dielectric layer 423 is formed on the back side of the anti-reflective layer 421.

The anti-reflective layer 421 is formed using oxynitride and is deposited to a thickness of 500Å, and the PMD dielectric layer 423 is deposited to a thickness of 1,000 Å to 5,000 Å.

Figure 4B:
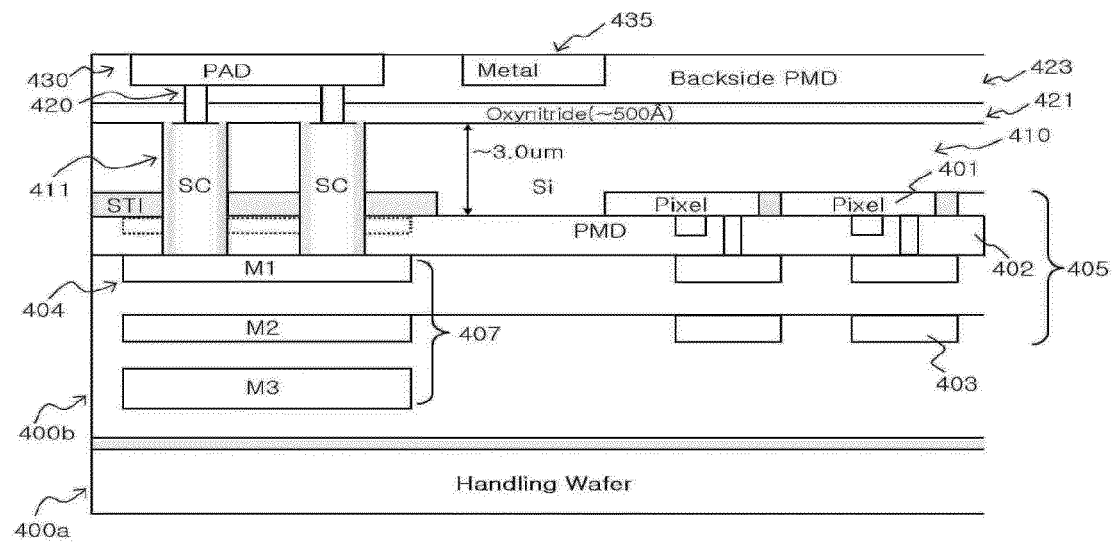
FIG. 4b illustrates a cross-section after defining spaces for vias and a pad by performing a photolithographic process for dual damascene according to the present invention.
Figure 4C:
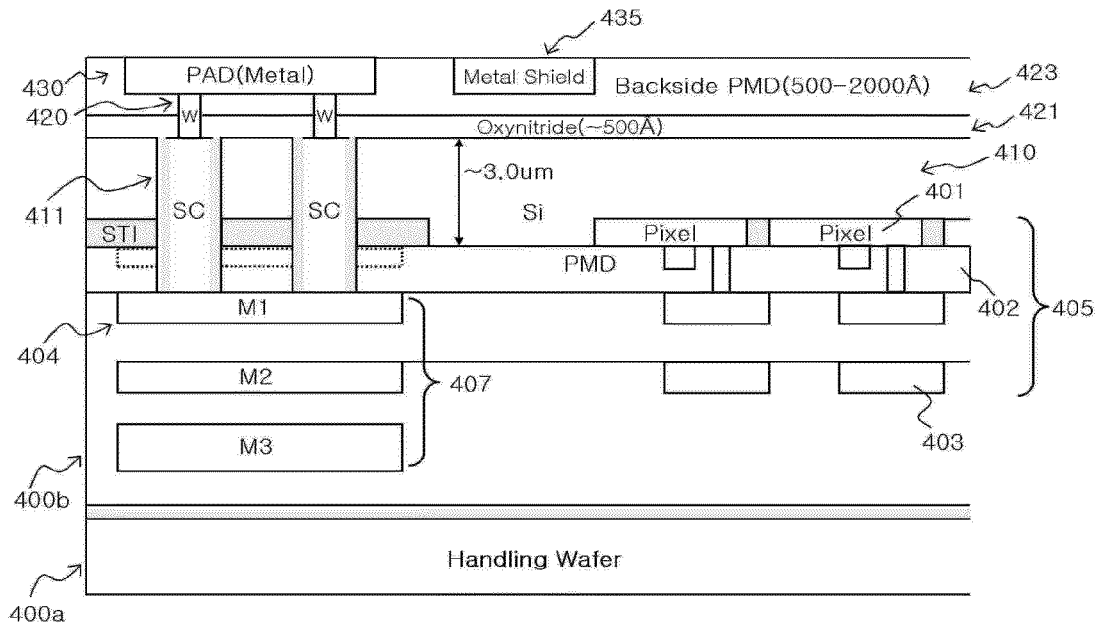
FIG. 4c illustrates a cross-section after filling a metal in the space for a pad by a damascene process and removing a remnant metal through planarization by a CMP process according to the present invention.

FIG. 4b illustrates a cross-section after defining spaces for vias and a pad by performing a photolithographic process for dual damascene according to the present invention, and FIG. 4c illustrates a cross-section after filling a metal in the space for a pad by a damascene process and removing a remnant metal through planarization by a CMP process according to the present invention.

Referring to FIGS. 4b and 4c, in the embodiment of the present invention, via holes 420 and a space 430 for a pad are defined by performing photolithography well known in the art such that a dual damascene process can be performed. Tungsten (W) is filled in via holes 420, and connections are completely formed by performing a dual damascene process thereafter.

Referring to FIG. 4c, a damascene process in accordance with the embodiment of the present invention includes a first step of filling copper (Cu) in the space 430 for a pad through electro/electroless plating and a second step of removing a remnant amount of copper (Cu) filled in the space 430 for a pad through planarization by CMP (chemical mechanical polishing).

Figure 4D:
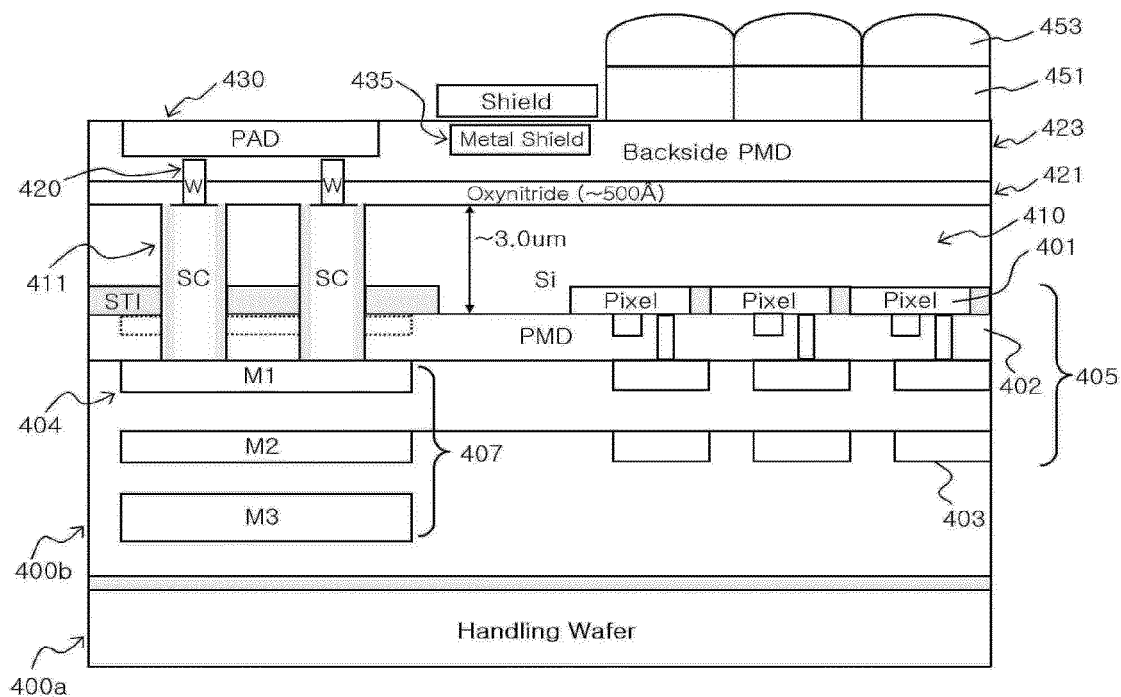
FIG. 4d illustrates a complete cross-section after forming the pad through the damascene process and forming color filters and microlenses according to the present invention.

FIG. 4d illustrates a complete cross-section after forming the pad through the damascene process and forming color filters and microlenses according to the present invention.

Referring to FIG. 4d, after a pad is formed by the damascene process in accordance with the embodiment of the present invention, in order to improve light collection capability of photodiodes 401 for back side illumination, the embodiment of the present invention includes a first step of forming optical filters 451 for transmitting light of a specified band, on the back side of the PMD dielectric material 423 and a second step of forming microlenses 453 for focusing light, on the optical filters 451.

As is apparent from the above description, in the present invention, advantages are provided in that, since a process for etching an Si substrate is omitted, it is possible to prevent the surfaces of super contacts and the Si substrate from being damaged, and since processes for forming super contacts and vias, which are generally known in the art, can be applied as they are, a pad of a wafer with a three-dimensional stacking structure can be formed in a simple manner.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A method for forming a pad in a wafer with a three-dimensional stacking structure, comprising:
    bonding a device wafer and a handling wafer, wherein the device wafer comprises an Si substrate;
    thinning a back side of the Si substrate;
    depositing an anti-reflective layer on the thinned back side of the Si substrate;
    depositing a back side dielectric layer on the anti-reflective layer;
    defining a space for a pad in the back side dielectric layer and forming vias that pass through the back side dielectric layer and the anti-reflective layer and contact back sides of super contacts which are formed on the Si substrate, wherein the defining a space for the pad and forming the vias are performed by a photolithographic process;
    filling one or more metals in the vias and the defined space for the pad; and
    removing a remnant amount of the metal filled in the space for the pad through planarization by a CMP (chemical mechanical polishing) process.

2. The method according to claim 1, wherein the vias are filled with tungsten (W).

3. The method according to claim 2, wherein filling of tungsten is implemented through electro/electroless plating.

4. The method according to claim 1, wherein the defined space for the pad is filled with copper (Cu) or aluminum (Al).

5. The method according to claim 4, wherein filling of copper or aluminum is implemented through electro/electroless plating.

6. The method according to claim 2, wherein the defined space for the pad is filled with copper (Cu) or aluminum (Al).

7. The method according to claim 1, wherein the vias and the pad are formed by a dual damascene process.

8. The method according to claim 1, wherein the anti-reflective layer comprises oxynitride.

9. The method according to claim 1, wherein the anti-reflective layer is deposited to a thickness of equal to or less than 500 Å.

10. The method according to claim 1, wherein the back side dielectric layer is deposited to a thickness of 1,000 Å to 5,000 Å.

11. The method according to claim 1, wherein the thinned Si substrate has a thickness of 2 μm to 6 μm.

12. The method according to claim 11, wherein the thinned Si substrate has a thickness of about 3 μm.

13. The method according to claim 1, further comprising forming optical filters for transmitting light of a specified band on the back side of the back side dielectric layer.

14. The method according to claim 13, further comprising forming microlenses for focusing light on the optical filters.

* * * * *